United States Patent
Kim

(10) Patent No.: US 10,568,247 B2
(45) Date of Patent: Feb. 18, 2020

(54) TRANSFERRING METHOD OF LIGHT-EMITTING DIODE

(71) Applicant: SAMSUNG DISPLAY CO., LTD., Yongin-si, Gyeonggi-do (KR)

(72) Inventor: Minsoo Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 163 days.

(21) Appl. No.: 15/196,528

(22) Filed: Jun. 29, 2016

(65) Prior Publication Data

US 2017/0064884 A1    Mar. 2, 2017

(30) Foreign Application Priority Data

Aug. 31, 2015 (KR) .................. 10-2015-0123202

(51) Int. Cl.
*H01R 43/00* (2006.01)
*H05K 13/04* (2006.01)

(52) U.S. Cl.
CPC ................ *H05K 13/0404* (2013.01)

(58) Field of Classification Search
CPC .... G02F 1/13; H05K 13/022; H05K 13/0404; H05K 13/0408; H05K 13/0413
See application file for complete search history.

(56) References Cited

U.S. PATENT DOCUMENTS

| | | | | |
|---|---|---|---|---|
| 5,155,903 A * | 10/1992 | Nakashima | ........ | H05K 13/0413 29/740 |
| 6,662,437 B2 * | 12/2003 | Kawashima | ....... | H05K 13/0417 29/740 |
| 6,691,401 B2 * | 2/2004 | Hata | ................... | H05K 13/0452 29/739 |
| 6,870,745 B2 * | 3/2005 | Suhara | ............... | H05K 13/0069 29/740 |
| 7,797,820 B2 * | 9/2010 | Shida | ................ | H01L 21/67144 228/180.21 |
| 7,899,561 B2 * | 3/2011 | Maenishi | ............... | H05K 13/08 29/743 |
| 8,701,262 B2 * | 4/2014 | Hauf | ....................... | B23P 11/02 29/446 |
| 2006/0196046 A1 * | 9/2006 | Ricketson | ......... | H05K 13/0413 29/834 |
| 2013/0126081 A1 | 5/2013 | Hu et al. | | |
| 2014/0064904 A1 | 3/2014 | Bibl et al. | | |

(Continued)

FOREIGN PATENT DOCUMENTS

| | | |
|---|---|---|
| CN | 1819760 A | 8/2006 |
| CN | 101080963 A | 11/2007 |

(Continued)

OTHER PUBLICATIONS

Chinese Office Action for Application No. 201610729381.6 dated Dec. 5, 2019.

*Primary Examiner* — Paul D Kim
(74) *Attorney, Agent, or Firm* — Cantor Colburn LLP

(57) ABSTRACT

A light-emitting diode transfer includes: a stage; a moving portion disposed on the stage and which performs a linear motion on the stage; a linear driving portion disposed on the moving portion and which performs a linear motion on the moving portion; and a head portion rotatably disposed on the linear driving portion and which picks up a light-emitting diode.

7 Claims, 12 Drawing Sheets

(56) References Cited

U.S. PATENT DOCUMENTS

| | | |
|---|---|---|
| 2014/0159043 A1 | 6/2014 | Sakariya et al. |
| 2014/0367705 A1 | 12/2014 | Bibl et al. |
| 2015/0076528 A1 | 3/2015 | Chan et al. |
| 2016/0120081 A1* | 4/2016 | Hosaka .................. B05B 15/55 700/283 |

FOREIGN PATENT DOCUMENTS

| | | |
|---|---|---|
| CN | 101562966 A | 10/2009 |
| CN | 104600016 A | 5/2015 |
| EP | 1761123 A2 | 3/2007 |
| KR | 1020140042320 A | 4/2014 |

* cited by examiner

ND OF LIGHT-EMITTING DIODE

TRANSFERRING METHOD OF LIGHT-EMITTING DIODE

This application claims priority to Korean Patent Application No. 10-2015-0123202, filed on Aug. 31, 2015, and all the benefits accruing therefrom under 35 U.S.C. § 119, the content of which in its entirety is herein incorporated by reference.

BACKGROUND

1. Field

One or more exemplary embodiments relate to an apparatus, and more particularly, to a light-emitting diode transfer and a transferring method of light-emitting diode.

2. Description of the Related Art

A light-emitting diode ("LED") is a semiconductor device in which holes and electrons are injected when a forward voltage is applied to a PN-junction diode, and energy generated by recombination of the holes and the electrons is converted to light energy.

An inorganic LED that emits light using an inorganic compound has been widely used in a backlight of a liquid crystal display ("LCD") television ("TV"), an electric light, an electronic display board, etc., and an organic LED that emits light by using an organic compound has been used in a miniature electronic apparatus such as a mobile phone, and a large-scale TV, recently.

SUMMARY

A conventional light-emitting diode transfer typically has low productivity with long manufacturing times.

One or more exemplary embodiments include a light-emitting diode transfer with improved production efficiency.

According to one or more exemplary embodiments, a light-emitting diode transfer includes: a stage; a moving portion disposed on the stage and which performs a linear motion on the stage; a second linear driving portion installed on the moving portion and which performs a linear motion on the moving portion; and a head portion rotatably disposed on the second linear driving portion and which picks up a light-emitting diode.

In an exemplary embodiment, the head portion may include: a head body portion rotatably connected to the second linear driving portion; and a pick-up portion connected to the head body portion and picking up the light-emitting diode.

In an exemplary embodiment, the head body portion may have a polygonal or circular cross-section in a direction perpendicular to a length direction of the head body portion.

In an exemplary embodiment, the pick-up portion may include a plurality of pick-up portions, and the pick-up portions may be spaced apart from each other along a circumference of the cross-section.

In an exemplary embodiment, the pick-up portion may include a plurality of pick-up portions, and the pick-up portions may be spaced apart from each other in a length direction of the head body portion.

In an exemplary embodiment, the head portion may further include: a rotation driving portion connected to at least one of the head body portion and the second linear driving portion, where the rotation driving portion rotates the head body portion.

In an exemplary embodiment, the second linear driving portion may include: a position variation portion connected to the moving portion; and a fixing bracket which is connected to the position variation portion and to which the head body portion is rotatably connected.

In an exemplary embodiment, the fixing bracket may be rotatable around a load applied direction which is a rotational axis thereof.

In an exemplary embodiment, the head body portion may be connected to the second linear driving portion in a way such that the head body portion is rotatable around a length direction of the head body portion which is a rotational axis thereof.

In an exemplary embodiment, the head portion may be connected to the second linear driving portion in a way such that the head portion is rotatable around a load applied direction.

In an exemplary embodiment, the head portion may include a plurality of head portions connected to the moving portion, and the head portions may be spaced apart from each other.

In an exemplary embodiment, the light-emitting diode transfer may further include: another linear driving portion connected to the moving portion and which allows the motion portion to perform the linear motion on the stage.

In an exemplary embodiment, the light-emitting diode may have a micrometer size.

In an exemplary embodiment, the light-emitting diode transfer may further include: a chamber which accommodates the stage, the moving portion, the second linear driving portion and the head portion therein.

According to one or more exemplary embodiments, a transferring method of a light-emitting diode include: seating a first substrate above a support; attaching a plurality of light-emitting diodes disposed above the first substrate to a head portion while rotating the head portion; disposing the head portion above a second substrate by allowing the head portion to perform a linear motion; and transferring a portion of the plurality of light-emitting diodes from the first substrate to the second substrate while rotating the head portion.

In an exemplary embodiment, the transferring of the portion of the plurality of light-emitting diodes from the first substrate to the second substrate while rotating the head portion may include: allowing the head portion to perform a linear motion.

In an exemplary embodiment, the transferring of the light-emitting diode may be performed under a vacuum state.

In an exemplary embodiment, the method may further include aligning the head portion with the first substrate.

In an exemplary embodiment, the method may further include aligning the head portion with the second substrate.

In an exemplary embodiment, the first substrate may include a base substrate or a carrier substrate, and the second substrate may include the carrier substrate or a display substrate.

Such an embodiment may be embodied by using a system, a method, a computer program, or a certain combination of a system, a method and a computer program.

In exemplary embodiment as set forth herein, a light-emitting diode transfer may increase productivity by simultaneously transferring a plurality of light-emitting diodes. In such an embodiment, a light-emitting diode transfer may reduce a consumed time by sequentially picking up and transferring a plurality of light-emitting diodes.

Such an embodiment of a light-emitting diode transfer may pick up light-emitting diodes of various shapes and dispose the picked-up light-emitting diodes at various locations.

BRIEF DESCRIPTION OF THE DRAWINGS

These and/or other features will become apparent and more readily appreciated from the following description of the exemplary embodiments, taken in conjunction with the accompanying drawings, in which.

DETAILED DESCRIPTION

Figure 1:
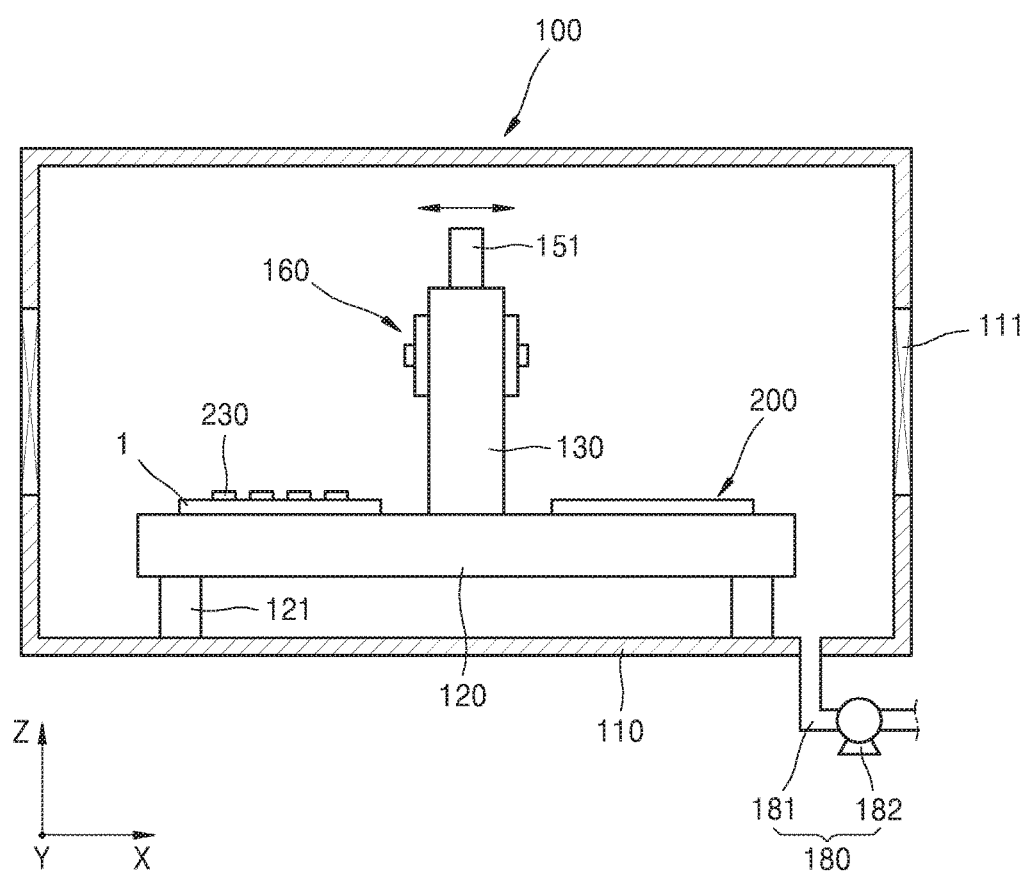
FIG. 1 is a front cross-sectional view illustrating a light-emitting diode ("LED") transfer according to an exemplary embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Expressions such as "at least one of" when preceding a list of elements, modify the entire list of elements and do not modify the individual elements of the list.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Herein, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Hereinafter, exemplary embodiments of the invention will be described with reference to the drawings.

Figure 2:
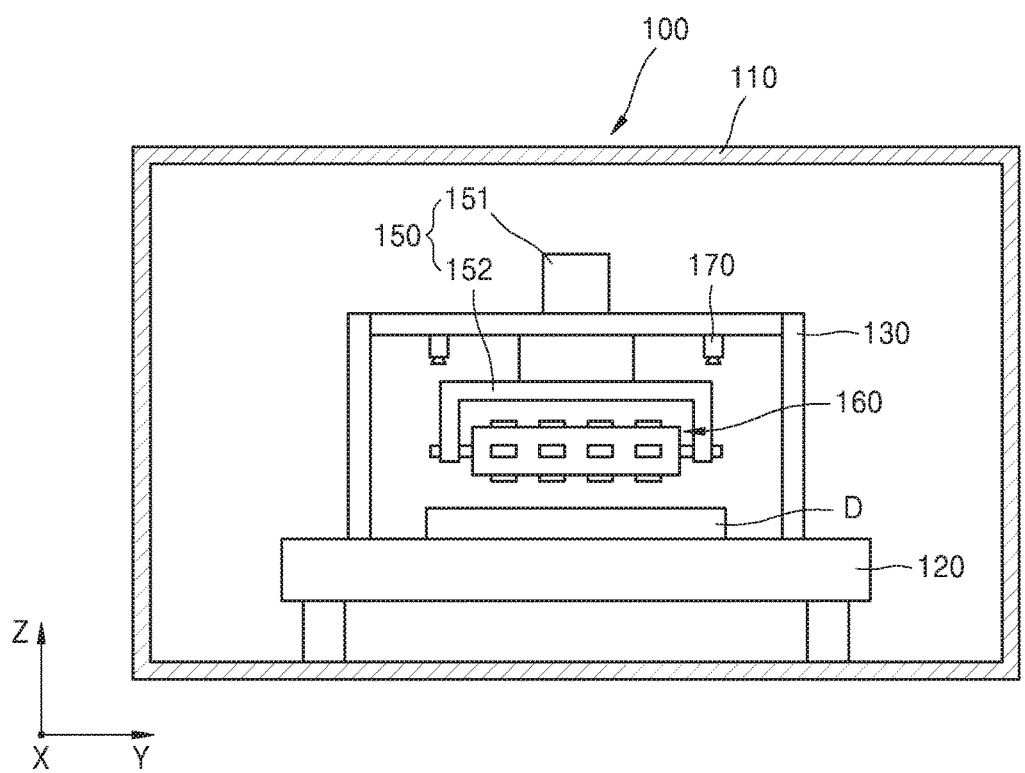
FIG. 2 is a side cross-sectional view illustrating the LED transfer illustrated in FIG. 1.
Figure 3:
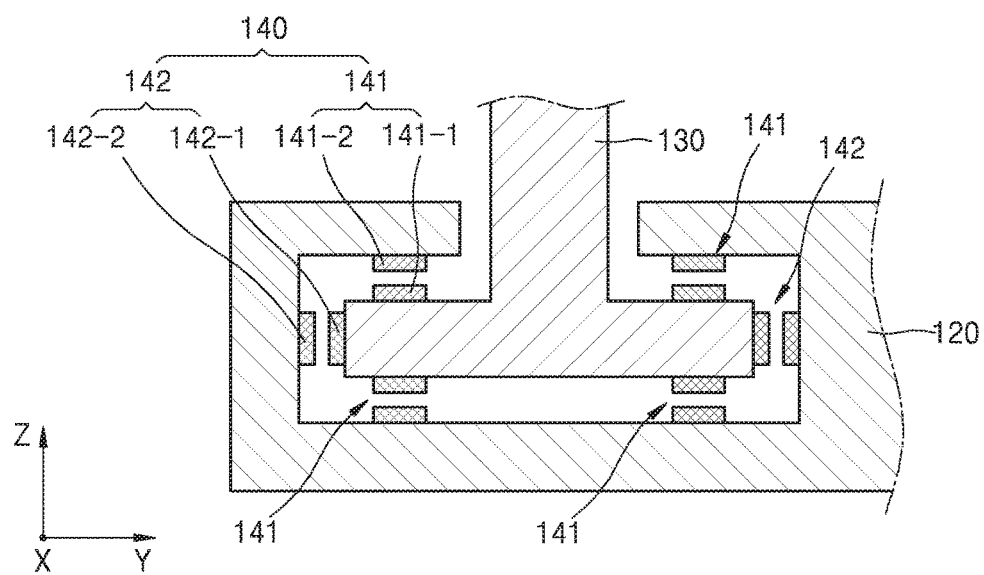
FIG. 3 is a cross-sectional view illustrating a linear driving portion of an LED transfer illustrated in FIG. 2.

FIG. 1 is a front cross-sectional view illustrating a light-emitting diode ("LED") transfer 100 according to an exemplary embodiment. FIG. 2 is a side cross-sectional view illustrating the LED transfer 100 illustrated in FIG. 1. FIG. 3 is a cross-sectional view illustrating a linear driving portion of an LED transfer illustrated in FIG. 2.

Referring to FIGS. 1 to 3, an exemplary embodiment of the LED transfer 100 may include a chamber 110, a stage 120, a moving portion 130, a first linear driving portion 140, a second linear driving portion 150, a head portion 160, a vision portion 170, and a pressure adjustor 180. Herein, the LED transfer means an LED transfer apparatus or an apparatus that transfers an LED from one place to another, e.g., transfers an LED on a surface of a substrate to a surface of another substrate.

In such an embodiment, the chamber 110 may define a space in an inside thereof and an open portion may be defined in the chamber 110. In such an embodiment, a gate valve 111 may be disposed in or installed to the open portion of the chamber 110 and open/close the open portion.

The chamber 110 may have various inner pressures. In one exemplary embodiment, for example, the chamber 110 may have an inner pressure that is same as or similar to atmospheric pressure while a process to be described below is performed inside the chamber 110. In such an embodiment, the pressure adjuster 180 may be omitted.

According to another exemplary embodiment, the chamber 110 may have an inner pressure that is same as or similar to vacuum while a process to be described below is performed inside the chamber 110. In such an embodiment, the pressure adjuster 180 may be connected to the chamber 110 and adjust the inner pressure of the chamber 110. In such an embodiment, when the gate valve 111 is open, the pressure adjuster 180 may maintain the inner pressure of the chamber 110 same as or similar to atmospheric pressure. In such an embodiment, while a process to be described below is performed inside the chamber 110, the gate valve 111 may be closed and the pressure adjuster 180 may maintain the inner pressure of the chamber 110 same as or similar to vacuum.

For convenience of description, an exemplary embodiment where the pressure adjustor 180 is connected to the chamber 110 and the inner pressure of the chamber 110 changes from atmospheric pressure to vacuum will hereinafter be mainly described.

The stage 120 may be fixed inside the chamber 110. In one exemplary embodiment, for example, the stage 120 may be fixed to an inner wall surface of the chamber 110. According to another exemplary embodiment, the stage 120 may be supported by a separate support frame 121 connected to and vertically extending from the lower surface of the chamber 110. For convenience of description, an exemplary embodiment where the stage 120 is supported by a support frame 121 will hereinafter be mainly described.

In an exemplary embodiment, the stage 120 may be in a plate shape. In such an embodiment, a second substrate 200 and a first substrate 1 may be disposed or seated on a side or surface (e.g., an upper side or surface) of the stage 120. In such an embodiment, a recess, into which the second substrate 200 and the first substrate 1 are inserted, may be defined or formed in a side of the stage 120. According to an alternative exemplary embodiment, a side of the stage 120 may be flat and the second substrate 200 and the first substrate 1 may be seated on the stage 120. According to another alternative exemplary embodiment, the stage 120 may have a protrusion (not shown) protruding from a side of the stage 120, and the protrusion may maintain or limit the positions of the second substrate 200 and the first substrate 1 by contacting the outer surfaces of the second substrate 200 and the first substrate 1.

In this case, the first substrate 1 may include one of a base substrate and a carrier substrate. Also, the second substrate 200 may include one of the carrier substrate and a display substrate.

A plurality of LEDs may be manufactured and disposed above the base substrate. In this case, the plurality of LEDs may be spaced apart from each other above the base substrate. Also, the plurality of LEDs disposed above the base substrate may be transferred and disposed above the carrier substrate. The position of the plurality of LEDs is temporarily attached to or fixed on the carrier substrate by using an adhesive layer, etc. The plurality of LEDs may be transferred from one of the base substrate or the carrier substrate to one of the carrier substrate or the second substrate 200. In an exemplary embodiment, the plurality of LEDs may be separated from one of the base substrate or the carrier substrate by using a known physical or chemical method. According to an exemplary embodiment, the plurality of LEDs may be separated from one of the base substrate or the carrier substrate by using a laser lift off ("LLO") method. According to another exemplary embodiment, after the plurality of LEDs is formed on the first substrate 1, the plurality of LEDs may be directly transferred to the second substrate 200.

Hereinafter, for convenience of description, a case where the first substrate 1 includes a transfer substrate, and the second substrate 200 includes a display substrate is mainly described.

The moving portion 130 may be coupled to the stage 120 and may slide on the stage 120. In an exemplary embodiment, the moving portion 130 may be connected or installed to a lateral portion of a surface of the stage 120 and linearly move on the stage 120.

The first linear driving portion 140 may be connected with at least one of the stage 120 and the moving portion 130 to allow the moving portion 130 to linearly move. In such an embodiment, the first linear driving portion 140 may be in various shapes, which will be described later in greater detail.

The second linear driving portion 150 may include a position variation portion 151 connected or installed to the moving portion 130 and a fixing bracket 152 connected or installed to the position variation portion 151. In an exemplary embodiment, the position variation portion 151 may be fixed to the moving portion 130 and change the position of the head portion 160. In such an embodiment, the position variation portion 151 may allow the head portion 160 to perform a linear motion with respect to the moving portion 130. In one exemplary embodiment, for example, the position variation portion 151 may allow the head portion 160 to perform a linear motion in a load applied direction (or a z-axis direction of FIG. 1).

In an exemplary embodiment, the position variation portion 151 may be similar to the first linear driving portion 140. The position variation portion 151 may be in various shapes. In one exemplary embodiment, for example, the position variation portion 151 may include a cylinder including a shaft of which position is variable. According to an alternative exemplary embodiment, the position variation portion 151 may include a magnetic levitation driving portion formed in a magnetic levitation manner. According to another alternative exemplary embodiment, the position variation portion 151 may include a linear motor connected between the head portion 160 and the moving portion 130. According to another alternative exemplary embodiment, the position variation portion 151 may include a motor connected or installed to the moving portion 130, a first gear unit connected to the motor, and a second gear unit connected to the first gear unit. In such an embodiment, the position variation portion 151 is not limited thereto, and may include any unit or structure that may allow the head portion 160 to perform a linear motion or to move linearly. However, for convenience of description, an exemplary embodiment where the position variation portion 151 includes a cylinder (not shown) will hereinafter be mainly described.

A portion of the fixing bracket 152 may be bent, and the bent portion of the fixing bracket 152 may be connected with the head portion 160.

The head portion 160 may be disposed on or installed to the moving portion 130 in a way such that the head portion 160 may perform a linear motion with respect to the moving portion 130. In such an embodiment, the head portion 160 may perform a linear motion in a load applied direction with respect to the moving portion 130. The head portion 160 will be described later in greater detail.

The vision portion 170 may be installed at various positions. In one exemplary embodiment, for example, the vision portion 170 may be installed to pass through the inner wall of the chamber 110. According to an alternative exemplary embodiment, the vision portion 170 may be connected or installed to the moving portion 130. According to another alternative exemplary embodiment, the vision portion 170 may be disposed or installed inside the chamber 110. However, for convenience of description, an exemplary embodiment where the vision portion 170 is connected or installed to the moving portion 130 will hereinafter be mainly described.

The vision portion 170 may be in various shapes. In one exemplary embodiment, for example, the vision portion 170 may include a high resolution camera. According to an alternative exemplary embodiment, the vision portion 170 may include a charge-coupled device ("CCD") camera.

The vision portion 170 may capture a position of at least one of the head portion 160, the first substrate 1, and the second substrate 200. In an exemplary embodiment, the position of the head portion 160 may be adjusted based on an image captured by the vision portion 170.

The pressure adjustor 180 may include a connection pipe 181 connected to the chamber 110, and a pump 182 connected or installed to the connection pipe 181. In an exemplary embodiment, a gas inside the connection pipe 181 flows depending on an operation of the pump 182, such that the inner pressure of the chamber 110 may be adjusted.

Hereinafter, the first linear driving portion 140 and the head portion 160 will be described in greater detail with reference to FIG. 3.

Referring to FIG. 3, the first linear driving portion 140 may include various devices and structures. In one exemplary embodiment, for example, the first linear driving portion 140 may include a cylinder. According to an alternative exemplary embodiment, the first linear driving portion 140 may include a linear motor. According to another alternative exemplary embodiment, the first linear driving portion 140 may include a motor and a ball screw connected with the motor. According to another alternative exemplary embodiment, the first linear driving portion 140 may operate in a magnetic levitation structure. According to another alternative exemplary embodiment, the first linear driving portion 140 may include a motor and a gear unit connected with the motor. However, the first linear driving portion 140 is not limited thereto and may include any device or structure installed between the moving portion 130 and the stage 120 to allow the moving portion 130 to perform a linear motion in a predetermined direction of the stage 120. Hereinafter, an exemplary embodiment where the first linear driving portion 140 operates in a magnetic levitation structure will be mainly described for convenience of description.

In an exemplary embodiment, an end of the moving portion 130 may be disposed in or inserted into the stage 120. According to an alternative exemplary embodiment, a portion of the stage 120 may protrude and may be inserted into the end of the moving portion 130. However, for convenience of description, an exemplary embodiment where the end of the moving portion 130 is inserted into the stage 120 will hereinafter be mainly described.

In such an embodiment, the first linear driving portion 140 may be installed between the moving portion 130 and the stage 120 as described above. In an exemplary embodiment, the first linear driving portion 140 may include an interval adjustor 141 disposed between the moving portion 130 and the stage 120. In such an embodiment, the first linear driving portion 140 may include a force-applying portion 142 disposed between the moving portion 130 and the stage 120.

The interval adjustor 141 may allow the moving portion 130 to be spaced from the stage 120 by using electromagnetic force. In an exemplary embodiment, the interval adjustor 141 may include a first interval adjustor 141-1 and a second interval adjustor 141-2 disposed to face each other between the moving portion 130 and the stage 120.

In an exemplary embodiment, one of the first interval adjustor 141-1 and the second interval adjustor 141-2 may be disposed on or installed to one of the moving portion 130 and the stage 120. In such an embodiment, the other of the first interval adjustor 141-1 and the second interval adjustor 141-2 may be disposed on or installed to the other of the moving portion 130 and the stage 120. For convenience of description, an exemplary embodiment where the first interval adjustor 141-1 is installed to the moving portion 130, and the second interval adjustor 141-2 is installed to the stage 120 will hereinafter be mainly described.

In such an embodiment, the first interval adjustor 141-1 and the second interval adjustor 141-2 may generate magnetic force having the same polarity. In an exemplary embodiment, the first interval adjustor 141-1 and the second interval adjustor 141-2 may include at least one of a permanent magnet and an electromagnet.

The first interval adjustor 141-1 and the second interval adjustor 141-2 may reduce friction between the moving portion 130 and the stage 120 while the moving portion 130 moves by separating the moving portion 130 from the stage 120 or maintaining the moving portion 130 and the stage 120 to be spaced apart from each other.

The force-applying portion 142 may include a first force-applying portion 142-1 and a second force-applying portion 142-2 disposed to face each other. In an exemplary embodiment, one of the first force-applying portion 142-1 and the second force-applying portion 142-2 may be installed to one of the moving portion 130 and the stage 120. In such an embodiment, one of the first force-applying portion 142-1 and the second force-applying portion 142-2 may be installed to the other of the moving portion 130 and the stage 120. For convenience of description, an exemplary embodiment where the first force-applying portion 142-1 is installed to the moving portion 130, and the second force-applying portion 142-2 is installed to the stage 120 will hereinafter be mainly described.

The first force-applying portion 142-1 and the second force-applying portion 142-2 may include at least one of a permanent magnet and an electromagnet. In an exemplary embodiment, the first force-applying portion 142-1 and the second force-applying portion 142-2 may be provided in plural in a movement direction (or an x-axis direction of FIG. 3) of the moving portion 130. The first force-applying portion 142-1 and the second force-applying portion 142-2 may move the moving portion 130 in a desired direction by generating polarities different from each other.

Figure 4:
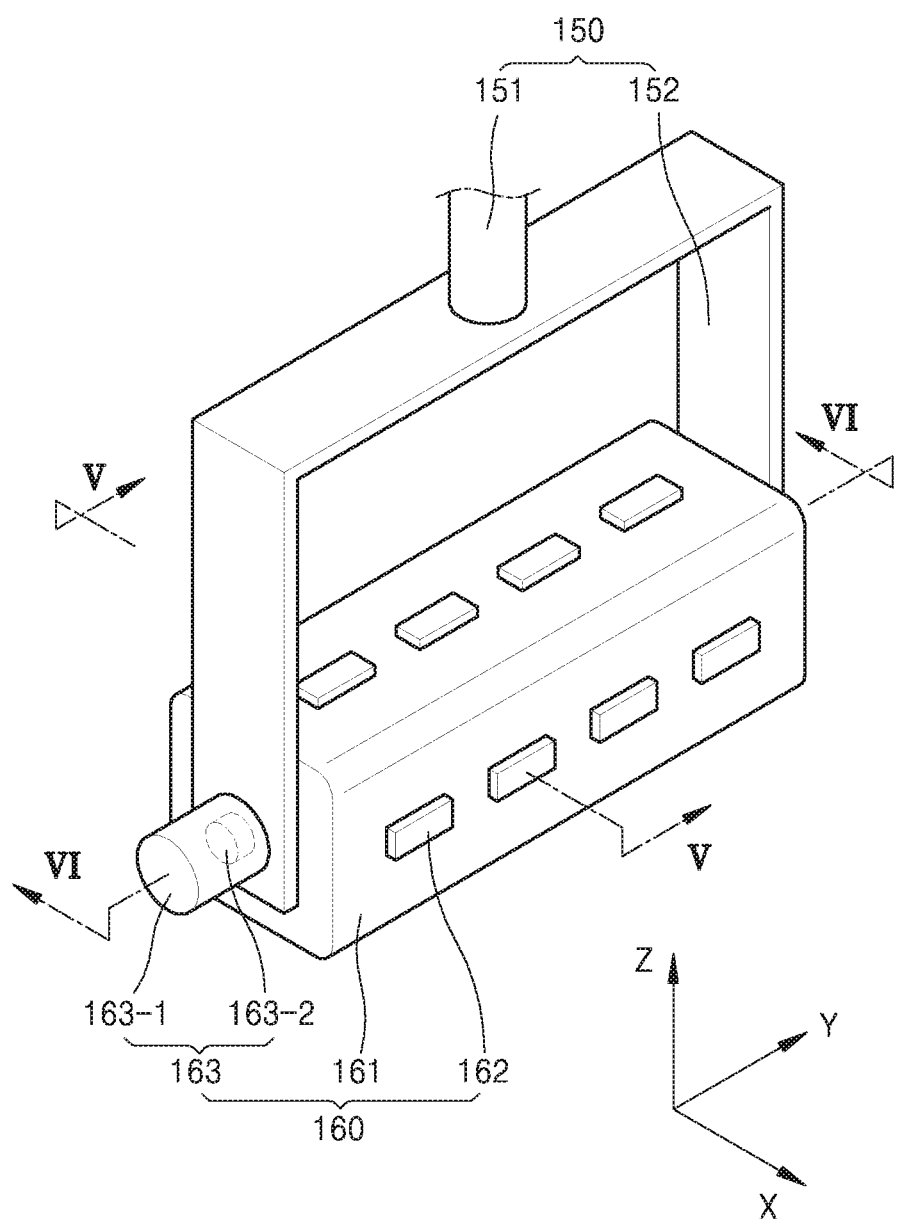
FIG. 4 is a perspective view illustrating a head portion illustrated in FIG. 2.
Figure 5:
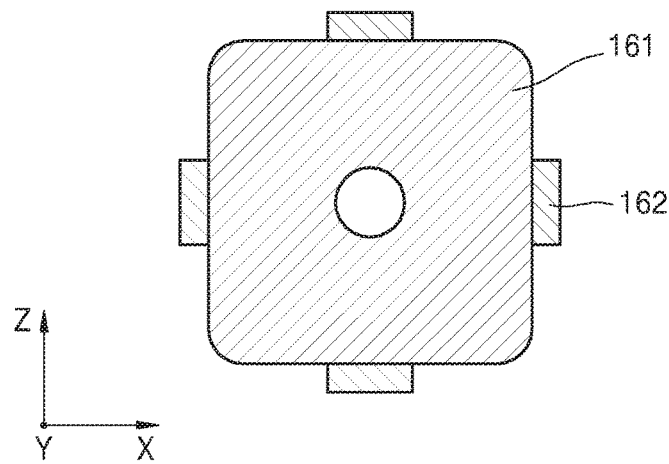
FIG. 5 is a cross-sectional view taken along line IV-IV of FIG. 3.
Figure 6:
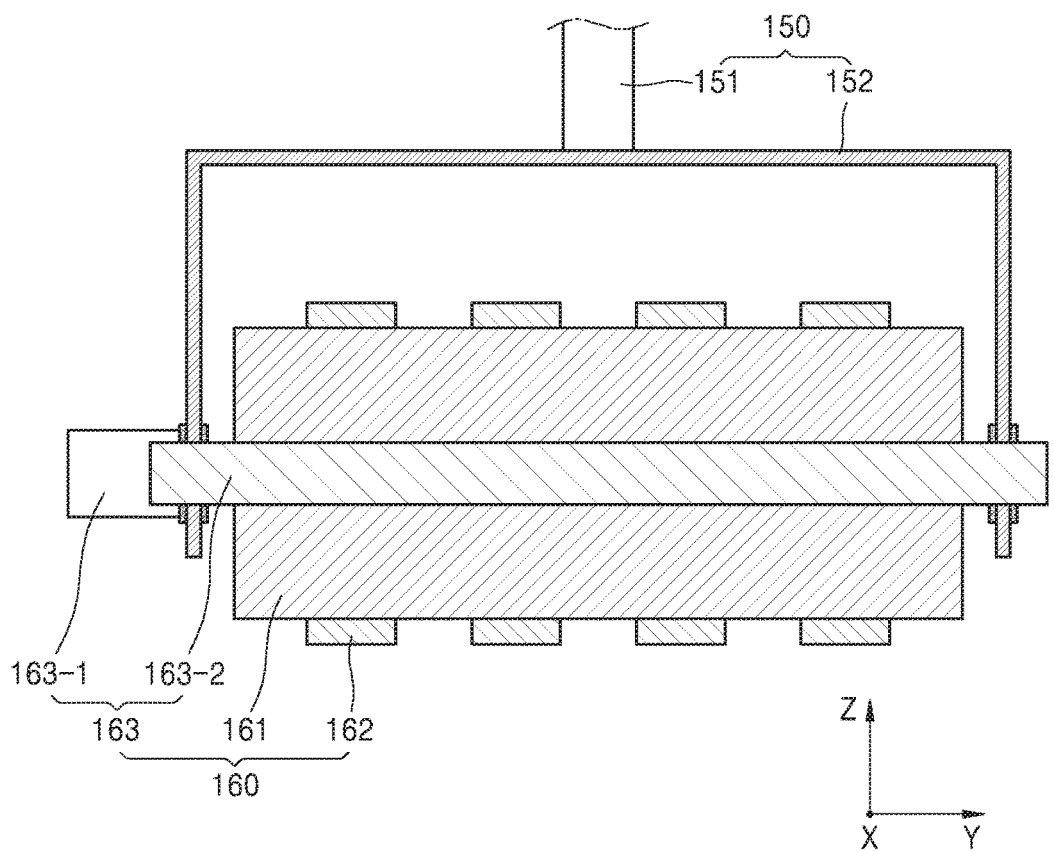
FIG. 6 is a cross-sectional view taken along line V-V of FIG. 3.

FIG. 4 is a perspective view illustrating a head portion 160 illustrated in FIG. 2. FIG. 5 is a cross-sectional view taken along line V-V of FIG. 4. FIG. 6 is a cross-sectional view taken along line VI-VI of FIG. 4.

Referring to FIGS. 4 to 6, the head portion 160 may include a head body portion 161, a rotational driving portion 163, and a pick-up portion 162.

The head body portion 161 may have a three-dimensional shape. In an exemplary embodiment, the head body portion 161 may have various shapes. In one exemplary embodiment, for example, the head body portion 161 may have a polygonal pillar shape or a circular pillar shape.

The rotational driving portion 163 may be connected with the head body portion 161 and rotate the head body portion 161. In an exemplary embodiment, the rotational driving portion 163 may be connected or fixed to the fixing bracket 152. The rotational driving portion 163 may rotate the head body portion 161 around a length direction (a y-axis of FIG. 4) of the head body portion 161 as a rotational axis.

The rotational driving portion 163 may include a rotational shaft 163-2 disposed inside or installed to pass through the head body portion 161, and a rotational motor 163-1 connected to the rotational shaft 163-2. In an exemplary embodiment, a method of connecting the rotational motor 163-1 with the rotational shaft 163-2 may be various. In one exemplary embodiment, for example, the rotational motor 163-1 and the rotational shaft 163-2 may be connected with each other by using pulleys respectively installed to the rotational shaft 163-2 and the rotational motor 163-1, and a belt connecting the pulleys. According to an alternative exemplary embodiment, gear units may be respectively installed to the rotational motor 163-1 and the rotational shaft 163-2, and the gear units may be connected with each other. According to another alternative exemplary embodiment, the rotational motor 163-1 and the rotational shaft 163-2 may be directly connected with each other. However, for convenience of description, an exemplary embodiment where the rotational motor 163-1 and the rotational shaft 163-2 are directly connected with each other will hereinafter be mainly described.

The pick-up portion 162 may separate an LED 230 from the first substrate 1, and move or transfer the LED 230 to the second substrate 200. In an exemplary embodiment, the pick-up portion 162 may attach the LED 230 thereon by using electrostatic force or adhesive force. However, the pick-up portion 162 is not limited thereto and may include any unit or structure that allows the LED 230 to be attached thereon.

The LED 230 may have a fine size. In one exemplary embodiment, for example, the LED 230 may have a micrometer size.

In an exemplary embodiment, the pick-up portion 162 may be provided in plural. The plurality of pick-up portions 162 may be spaced apart from each other in a length direction (or a y-axis direction of FIG. 6) of the head body portion 161. In such an embodiment, the plurality of pick-up portions 162 may be spaced apart from each other along a circumference of the cross-section perpendicular to the length direction of the head body portion 161. In an exemplary embodiment, where the cross-section of the head body portion 161 is a polygon, the pick-up portion 162 may be arranged in a line on each side of the polygon.

Figure 7:
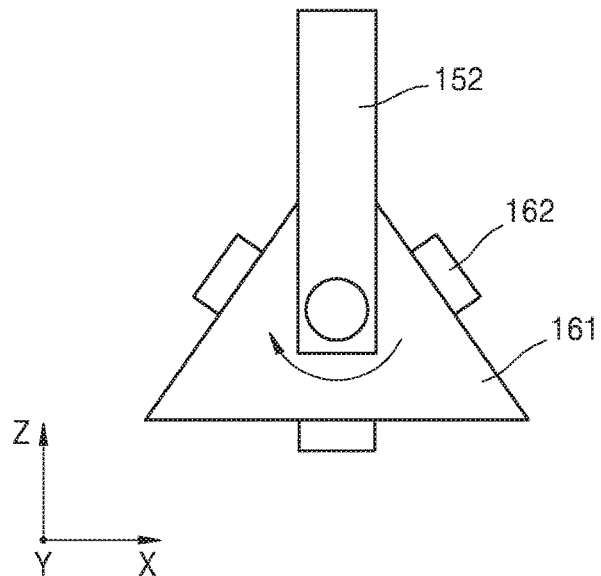
FIG. 7 is a side view illustrating a head portion illustrated in FIG. 2 according to an exemplary embodiment.
Figure 8:
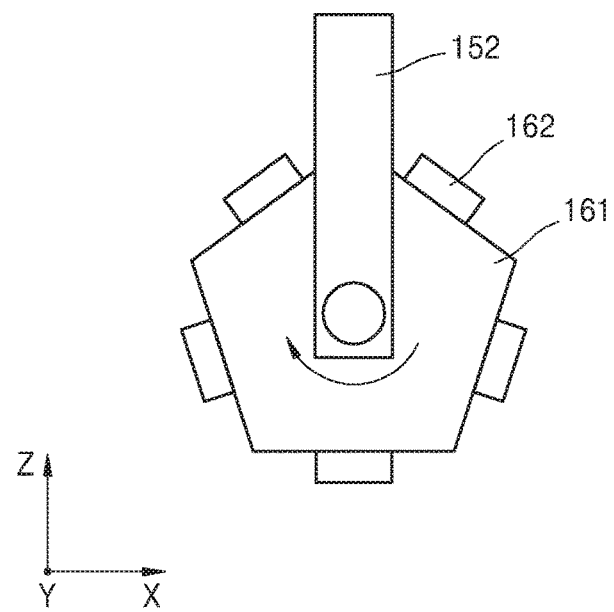
FIG. 8 is a side view illustrating a head portion illustrated in FIG. 2 according to an alternative exemplary embodiment.
Figure 9:
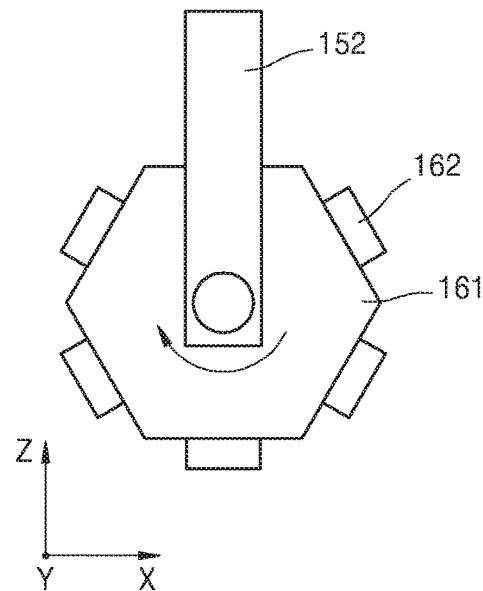
FIG. 9 is a side view illustrating a head portion illustrated in FIG. 2 according to another alternative exemplary embodiment.
Figure 10:
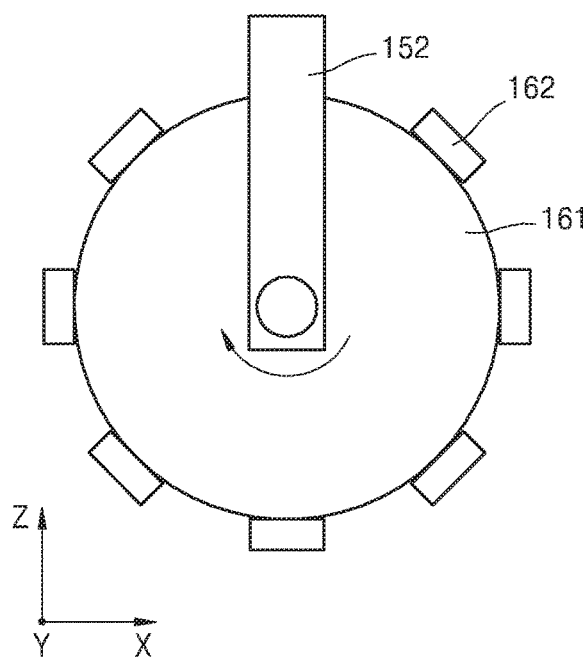
FIG. 10 is a side view illustrating a head portion illustrated in FIG. 2 according to still another alternative exemplary embodiment.

FIG. 7 is a side view illustrating a head portion illustrated in FIG. 2 according to an exemplary embodiment. FIG. 8 is a side view illustrating a head portion illustrated in FIG. 2 according to an alternative exemplary embodiment. FIG. 9 is a side view illustrating a head portion illustrated in FIG. 2 according to another alternative exemplary embodiment. FIG. 10 is a side view illustrating a head portion illustrated in FIG. 2 according to still another alternative exemplary embodiment.

Referring to FIGS. 7 to 10, the head body portion 161 may have various shapes as described above. In one exemplary embodiment, for example, the head body portion 161 may have a trigonal prism shape. In an exemplary embodiment, a cross-section perpendicular to a length direction of the head body portion 161 may be a triangle as illustrated in FIG. 7. In an exemplary embodiment, the pick-up portion 162 may be installed to the head body portion 161 such that the pick-up portions 162 are spaced apart from each other in a length direction of the trigonal prism. The pick-up portions 162 may be arranged such that the plurality of pick-up portions 162 are spaced apart from each other in a line on three sides formed in the length direction of the trigonal prism.

According to an alternative exemplary embodiment, as illustrated in FIG. 8, the head body portion 161 may have a pentagonal pillar shape. In such an embodiment, as described above, the plurality of pick-up portions 162 may be spaced apart from each other on the sides of the head body portion 161, respectively.

According to another alternative exemplary embodiment, as illustrated in FIG. 9, the head body portion 161 may have a hexagonal pillar shape. In such an embodiment, the pick-up portion 162 may be installed on each side of the head body portion 161.

According to another alternative exemplary embodiment, as illustrated in FIG. 10, the head body portion 161 may have a circular pillar shape. In such an embodiment, the pick-up portions 162 may be spaced from each other with a constant interval on the surface of the head body portion 161.

Figure 11:
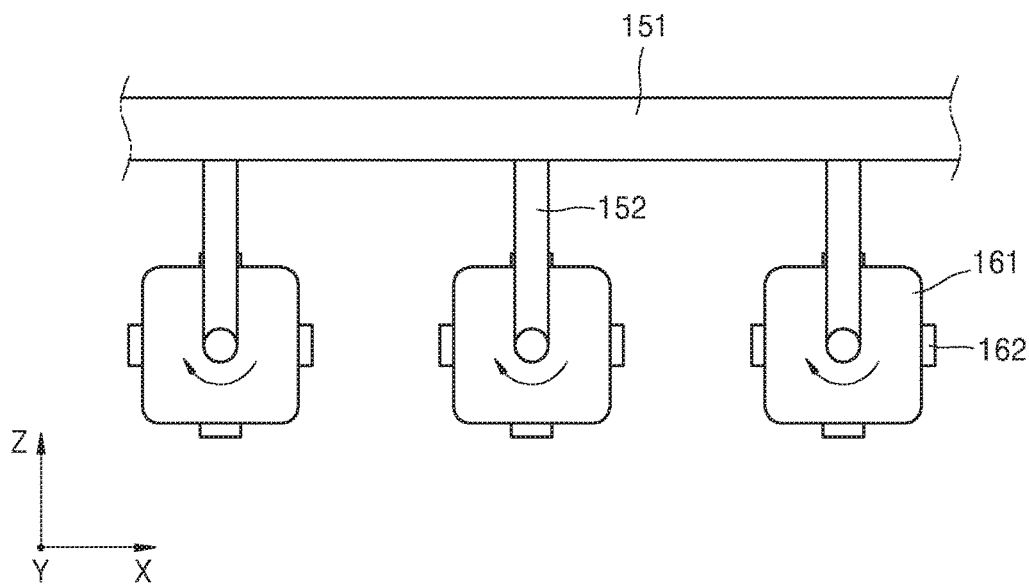
FIG. 11 is a side view illustrating the arrangement of a head portion illustrated in FIG. 2 according to an exemplary embodiment.

FIG. 11 is a side view illustrating the arrangement of the head body portion illustrated in FIG. 2 according to an exemplary embodiment.

Referring to FIG. 11, the head portion 160 and the fixing bracket 152 may be provided in plural. In an exemplary embodiment, the plurality of head portions 160 may be spaced apart from each other on the moving portion 130 (for example, the plurality of head portions 160 may be spaced apart from each other in an x-axis direction of FIG. 11). In such an embodiment, each fixing bracket 152 may be installed to correspond to each head portion 160.

In such an embodiment, where the head portion 160 is provided in plural, the head body portions 161 may be connected with one rotational motor 163-1 and rotate simultaneously. According to an alternative exemplary embodiment, each rotational motor 163-1 may be connected to each head body portion 161 and each of the head body portions 161 may individually rotate or rotate independently of each other.

Hereinafter, an exemplary embodiment of a process of manufacturing an organic light-emitting display device by using the LED transfer 100 will be described with reference to FIGS. 12 to 14.

Figure 12:
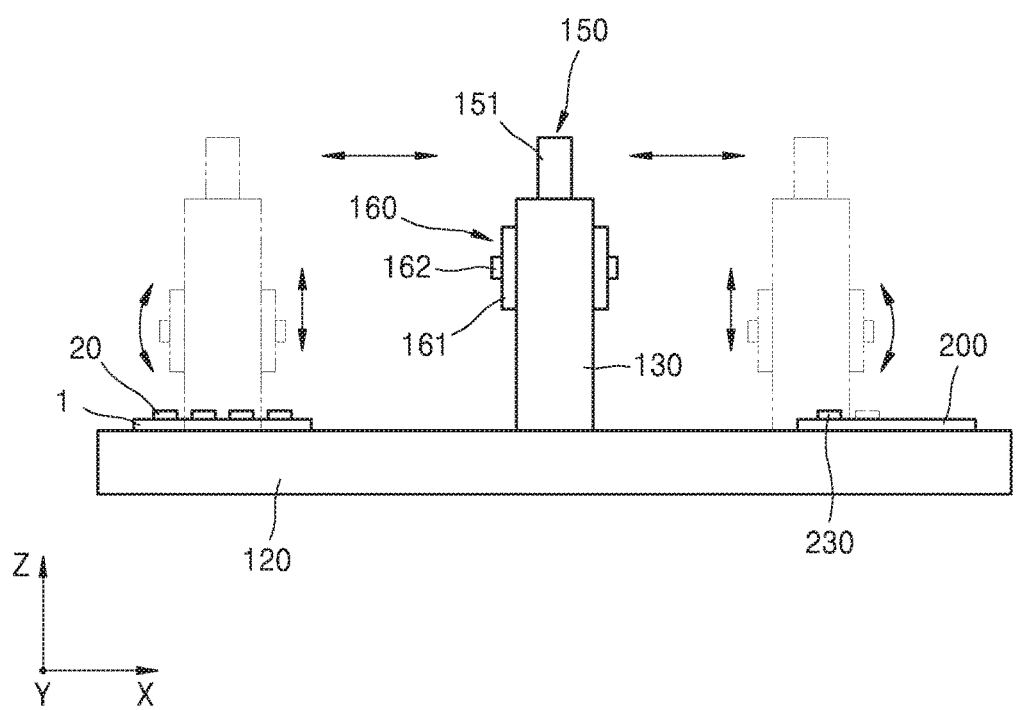
FIG. 12 is a view illustrating an exemplary embodiment of a process of manufacturing an organic light-emitting display device by using an LED transfer illustrated in FIG. 1.

FIG. 12 is a view illustrating an exemplary embodiment of a process of manufacturing an organic light-emitting display device by using the LED transfer 100 illustrated in FIG. 1. FIG. 13 is a schematic plan view illustrating a display device 10 manufactured according to a manufacturing process illustrated in FIG. 12. FIG. 14 is a schematic cross-sectional view illustrating a display device of FIG. 13 taken along line A-A according to an exemplary embodiment. In the following description, like reference numerals denote like elements.

Figure 13:
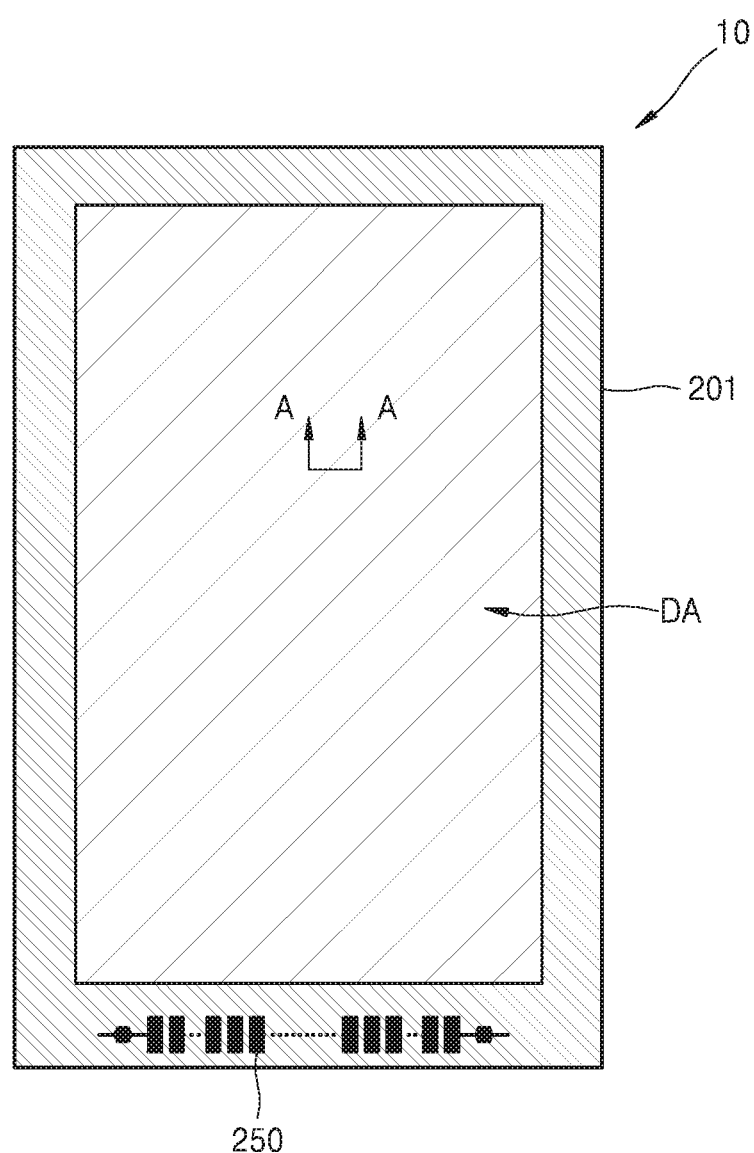
FIG. 13 is a schematic plan view illustrating a display device manufactured by an exemplary embodiment of a manufacturing process illustrated in FIG. 12.
Figure 14:
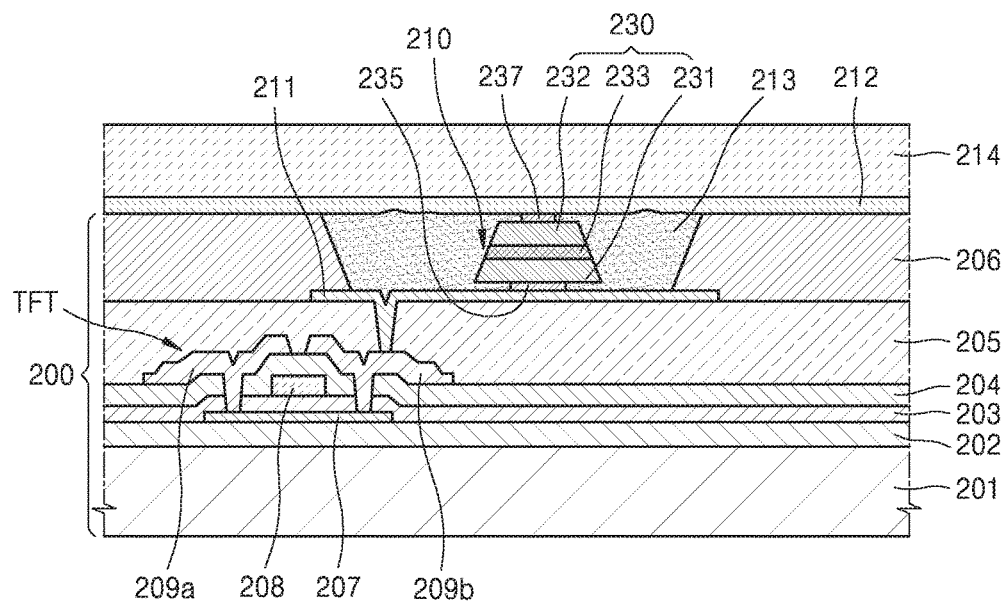
FIG. 14 is a schematic cross-sectional view illustrating a display device of FIG. 13 taken along line A-A according to an exemplary embodiment.

Referring to FIGS. 12 to 14, in an exemplary embodiment, the LED transfer 100 may transfer the LED 230 on the first substrate 1 to the second substrate 200. In an exemplary embodiment, the first substrate 1, on which the LED 230 is disposed, may introduced into the chamber 110, and then the first substrate 1 may be seated on the stage 120. In such an embodiment, the first substrate 1 may be moved into the chamber 110 via a separate robot arm, a shuttle, etc. provided inside or outside the chamber 110.

Similar to the first substrate 1, the second substrate 200 may be transferred into the chamber 110. In an exemplary embodiment, the LED transfer 100 may manufacture the display device 10 by transferring the LED 230 of the first substrate 1 onto the second substrate 200.

In an exemplary embodiment, the LED transfer 100 may pick up the LED 230 on the first substrate 1. In such an embodiment, the first linear driving portion 140 may dispose the moving portion 130 on the first substrate 1.

The second linear driving portion 150 may dispose the head body portion 161 at a predetermined position on the first substrate 1 by lowering the head portion 160 toward the first substrate 1. In an exemplary embodiment, the positions of the head body portion 161 and the first substrate 1 may be detected and the position of the head body portion 161 may be changed based on an image captured by the vision portion 170. In one exemplary embodiment, for example, an alignment mark is provided or formed on the first substrate 1, and the position of the head body portion 161 may be adjusted by detecting the positions of the head body portion 161 and the first substrate 1 based on an image captured by the vision portion 170 and adjusting the first linear driving portion 140 and the second linear driving portion 150. According to an alternative exemplary embodiment, the position of the head body portion 161 may be adjusted by capturing an alignment mark on the stage 120. According to another alternative exemplary embodiment, the position of the head body portion 161 may be adjusted by measuring the shape of the head body portion 161 and the first substrate 1 by using the vision portion 170. In an exemplary embodiment, a method of adjusting the position of the head body portion 161 by using the vision portion 170 is not limited to the above methods, and may include any method of adjusting the position of the head body portion 161 by detecting the positions of the head body portion 161 and the first substrate 1.

When the head body portion 161 is disposed at a predetermined position, the head body portion 161 is lowered by the second linear driving portion 150, and then the pick-up portion 162 may attach the LED 230 thereon. In an exemplary embodiment, the LEDs 230 may be simultaneously attached on the plurality of pick-up portions 162 arranged in a length direction of the head body portion 161.

The second linear driving portion 150 may raise the head body portion 161, and the rotational driving portion 163 may operate to rotate the head body portion 161 by a predetermined angle. Due to rotation of the head body portion 161, the pick-up portion 162 not being attached the LED 230 thereon may be disposed to face the first substrate 1 again.

When the above process is completed, the first linear driving portion 140 may operate and dispose the head portion 161 above the LED above the base substrate 1. In this case, the second linear driving portion 150 may operate as described above.

When the first linear driving portion 140 and the second linear driving portion 150 operate again, the head body portion 161 may descend and the pick-up portion 162 may attach the LED 230 thereon. This operation may be repeatedly performed until the LEDs 230 are respectively attached on all of the pick-up portions 162 of the head portion 160.

When the LEDs 230 are respectively attached on all of the pick-up portions 162 of the head body portion 161, the first linear driving portion 140 may operate and move the moving portion 130 from the first substrate 1 to the second substrate 200 (an x-axis direction of FIG. 12). In an exemplary embodiment, the vision portion 170 captures the positions of the second substrate 200 and the head body portion 161, and the position of the head body portion 161 may be adjusted based on the captured result. The method of adjusting the position of the head body portion 161 is substantially the same as such a method described above, and any repetitive detailed description thereof will be omitted.

When the position of the head body portion 161 reaches a predetermined position, the second linear driving portion 150 may operate and lower the head body portion 161 to transfer the LED 230 to the second substrate 200.

In an exemplary embodiment, when the second linear driving portion 150 operates, the LEDs 230 respectively attached on the plurality of pick-up portions 162 linearly arranged on a side of the head body portion 161 may be transferred to the second substrate 200. In such an embodiment, when the second linear driving portion 150 operates reversely and raises the head body portion 161, the rotational driving portion 163 may operate to allow the pick-up portions 162 arranged in a line on another side of the head body portion 161 to face the second substrate 200. In an exemplary embodiment, the first linear driving portion 140 may move the moving portion 130 by a small amount in an x-axis direction of FIG. 12. The second linear driving portion 150 may lower the head body portion 161 and transfer the LEDs 230 of the pick-up portions 162 linearly arranged on another side of the head body portion 161 to the second substrate 200. This operation may be repeatedly performed until the LEDs 230 of all of the pick-up portions 162 are transferred to the second substrate 200.

When the transferring of the LEDs 230 of all of the pick-up portions 162 of the head body portion 161 is completed, the first linear driving portion 140 may dispose the moving portion 130 to the first substrate 1 and repeatedly perform the above operation.

When the above operation is completed, the second substrate 200, to which the LEDs 230 have been transferred, is transferred to the outside and the display device 10 may be manufactured by performing the next process.

The above manufactured display device 10 may include the second substrate 200 and an emission layer 210 on the second substrate 200.

In an exemplary embodiment, the second substrate 200 may include a substrate 201, a thin film transistor ("TFT") on the substrate 201, and a planarization layer 205 on the TFT. A first electrode 211 connected with the TFT through a via hole may be provided or formed on the planarization layer 205. In such an embodiment, the second substrate 200 may include a bank layer 206 disposed to cover a portion of the first electrode 211.

A display area DA and a non-display area outside the display area DA may be defined on the substrate 201. The emission layer 210 may be disposed in the display area DA, and a power line (not shown) etc. may be disposed in the non-display area. In such an embodiment, a pad portion 250 may be provided or disposed in the non-display area.

The substrate 201 may include various materials. In one exemplary embodiment, for example, the substrate 201 may include a transparent glass material having $SiO_2$ as a primary component. However, the substrate 201 is not limited thereto and may include a transparent plastic material and thus be flexible. The plastic material may include at least one insulating organic material selected from polyether sulfone ("PES"), polyacrylate ("PAR"), polyetherimide ("PEI"), polyethylene naphthalate ("PEN"), polyethylene terephthalate ("PET"), polyphenylene sulfide ("PPS"), polyacrylate ("PAR"), polyimide, polycarbonate ("PC"), cellulose triacetate ("TAC") and cellulose acetate propionate ("CAP").

In an exemplary embodiment, where the substrate 201 is a substrate for a bottom-emission type display device that produces an image in a direction of the substrate 201, the substrate 201 may include a transparent material. In an alternative exemplary embodiment, where the substrate 201 is a substrate for a top-emission type display device that produces an image in an opposite direction of the substrate 201, the substrate 201 may not only include a transparent material. In an exemplary embodiment, the substrate 201 may include a metal.

In an exemplary embodiment, where the substrate 201 includes a metal, the substrate 201 may include at least one selected from F, Cr, Mn, Ni, Ti, Mo, steel use stainless ("SUS"), Invar alloy, Inconel alloy, and Kovar alloy, but is not limited thereto.

A buffer layer 202 may be provided or formed on the substrate 201. The buffer layer 202 may provide a planarized surface above the substrate 201, and effectively prevent penetration of foreign substances or moisture via the substrate 201. In one exemplary embodiment, for example, the buffer layer 202 may include an inorganic material such as a silicon oxide, a silicon nitride, a silicon oxynitride, an aluminum oxide, an aluminum nitride, a titanium oxide or a titanium nitride, or an organic material such as polyimide, polyester and acryl, for example. The buffer layer 202 may have a multi-layer structure, in which each layer may include at least one of the materials above.

The TFT may include an active layer 207, a gate electrode 208, a source electrode 209a, and a drain electrode 209b.

An exemplary embodiment where the TFT is a top gate-type TFT, in which the active layer 207, the gate electrode 208, the source electrode 209a and the drain electrode 209b are sequentially formed, will hereinafter be described, but exemplary embodiments are not limited thereto and various types of TFTs such as a bottom gate-type TFT may be adopted.

In such an embodiment, the active layer 207 may include a semiconductor material, for example, amorphous silicon or poly crystalline silicon. However, exemplary embodiment is not limited thereto and the active layer 207 may include various materials. According to an exemplary embodiment, the active layer 207 may include an organic semiconductor material.

According to an alternative exemplary embodiment, the active layer 207 may include an oxide semiconductor material. In one exemplary embodiment, for example, the active layer 207 may include Groups 12, 13, and 14 metallic elements such as Zn, In, Ga, Sn, Cd, Ge, and an oxide of a combination thereof.

A gate insulating layer 203 is provided or formed on the active layer 207. The gate insulating layer 203 insulates the gate electrode 208 from the active layer 207. The gate insulating layer 203 may include a single layer or a plurality of layers including an inorganic material such as a silicon oxide and/or a silicon nitride.

The gate electrode 208 is provided or formed above the gate insulating layer 203. The gate electrode 208 may be connected with a gate line (not shown) that applies an on/off-signal to the TFT.

The gate electrode 208 may include a low resistance metallic material. The gate electrode 208 may include a single layer or layers including at least one of Al, Pt, Pd, Ag, Mg, Au, Ni, Nd, Ir, Cr, Li, Ca, Mo, Ti, W, and Cu by taking into account adhesion with an adjacent layer, a surface planarization characteristic of a stacked layer, a processing characteristic, etc.

An interlayer insulating layer 204 is provided or formed on the gate electrode 208. The interlayer insulating layer 204 insulates the source electrode 209a and the drain electrode 209b from the gate electrode 208. The interlayer insulating layer 204 may include a single layer or a plurality of layers including an inorganic material. In an exemplary embodiment, the inorganic material may be a metallic oxide or a metallic nitride. In one exemplary embodiment, for example, the inorganic material may include a silicon oxide ($SiO_2$), a silicon nitride (SiNx), a silicon oxynitride (SiON), an aluminum oxide ($Al_2O_3$), a titanium oxide ($TiO_2$), a tantalum oxide ($Ta_2O_5$), a hafnium oxide ($HfO_2$), a zinc oxide ($ZnO_2$), etc.

The source electrode 209a and the drain electrode 209b are formed on the interlayer insulating layer 204. The source electrode 209a and the drain electrode 209b may include a single layer or layers including at least one of Al, Pt, Pd, Ag, Mg, Au, Ni, Nd, Ir, Cr, Li, Ca, Mo, Ti, W, and Cu. The source electrode 209a and the drain electrode 209b contact regions of the active layer 207.

The planarization layer 205 is formed on the TFT. The planarization layer 205 covers the TFT to resolve a step difference caused by the TFT and thereby prevents a formation of a defective emission layer 210 due to lower irregularities by planarizing the upper surface of the TFT.

The planarization layer 205 may include a single layer or layers including an organic material. The organic material may include a general polymer such as polymethyl methacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylenebased polymer, a vinyl alcohol-based polymer, and a blend thereof. In such an embodiment, the planarization layer 205 may include a composite stacked layer including an inorganic insulating layer and an organic insulating layer.

The first electrode 211 and the bank layer 206 may be disposed on the planarization layer 205.

The first electrode 211 may be electrically connected with the TFT. Specifically, the first electrode 211 may be electrically connected with the drain electrode 209b via a contact hole formed in the planarization layer 205. The first electrode 211 may have various shapes, and for example, may be patterned in an island shape.

The bank layer 206 may be disposed on the first electrode 211 and the planarization layer 205 and define a pixel region. The bank layer 206 may defined a space in which the LED 230 is disposed. In an exemplary embodiment, the bank layer 206 may include a thermoplastic resin such as polycarbonate (PC), polyethylene terephthalate (PET), polyether sulfone (PES), polyvinyl butyral (PVB), polyphenylene ether (PPE), polyamide, polyetherimide (PEI), a norbornene-based resin, a methacrylic resin, a cyclic polyolefin-based resin, etc., a thermosetting resin such as an epoxy resin, a phenolic resin, a urethane resin, an acrylic resin, a vinyl ester resin, an imide-based resin, a urethane-based resin, a urea resin, a melamine resin, etc., or an organic insulating material such as polystyrene, polyacrylonitrile, polycarbonate, etc., but not being limited thereto. In an alternative exemplary embodiment, the bank layer 206 may include an inorganic insulating material including an inorganic oxide and an inorganic nitride such as SiOx, SiNx, SiNxOy, AlOx, TiOx, TaOx, ZnOx, etc., but is not limited thereto. According to another alternative exemplary embodiment, the bank layer 206 may include an opaque material such as a black matrix material. In an exemplary embodiment, the insulating black matrix material may include an organic resin, glass paste, a resin including black pigment or paste, a metallic particle, for example, Ni, Al, Mo, and an alloy thereof, a metallic oxide particle (for example, a chrome oxide), or a metallic nitride particle (for example, a chrome nitride). The bank layer 206 is not limited to the above materials, and may include various materials depending on the structure of the LED 230, connection of the LED 230 and the electrodes, etc.

A passivation layer 213 may be disposed in a space between the bank layers 206. In an exemplary embodiment, the passivation layer 207 may be disposed between the LED 230 and the bank layer 206 and effectively prevent a second electrode 212 from contacting the first electrode 211.

The passivation layer 213 may be transparent or semitransparent with respect to a visible wavelength and thus may not substantially deteriorate light extraction efficiency of a completed system. A lateral wall passivation layer may include various materials, for example, epoxy, PMMA, benzocyclobutene ("BCB"), polyimide, and polyester, but is not limited thereto. According to an exemplary embodiment, the passivation layer 207 is formed around the LED 230 by an ink jet method.

The LED 230 emits red, green or blue light, and may produce white light by using a fluorescent material or combining colors. The LED 230 may include a first semiconductor layer 231, a second semiconductor layer 232 and an intermediate layer 233 between the first semiconductor layer 231 and the second semiconductor layer 232.

The first semiconductor layer 231 may be implemented as, for example, a p-type semiconductor layer. The p-type semiconductor layer may include a semiconductor material having a composition equation of $In_xAl_yGa_{1-x-y}N$ ($0 \leq x \leq 1$, $0 \leq y \leq 1$, $0 \leq x+y \leq 1$), and may include, for example, GaN, AlN, AlGaN, InGaN, InN, InAlGaN, AlInN, etc. The first semiconductor layer 231 may be doped with p-type dopants such as Mg, Zn, Ca, Sr, and Ba.

The second semiconductor layer 232 may include, for example, an n-type semiconductor layer. An n-type semiconductor layer may include a semiconductor material having a composition equation of $In_xAl_yGa_{1-x-y}N$ ($0 \leq x \leq 1$, $0 \leq y \leq 1$, $0 \leq x+y \leq 1$), and may include, for example, GaN, AlN, AlGaN, InGaN, InN, InAlGaN, AlInN, etc. The second semiconductor layer 232 may be doped with n-type dopants such as Si, Ge, and Sn.

However, exemplary embodiments are not limited thereto, and alternatively, the first semiconductor layer 231 may include the n-type semiconductor layer and the second semiconductor layer 232 may include the p-type semiconductor layer.

The intermediate layer 233 is a region where electrons and holes recombine. When the electron and the hole recombine, they may make transition to a lower energy level and emit light having a corresponding wavelength. The intermediate layer 233 may include a semiconductor material having a composition equation of $In_xAl_yGa_{1-x-y}N$ ($0 \leq x \leq 1$, $0 \leq y \leq 1$, $0 \leq x+y \leq 1$), and may include a single quantum well structure or a multi-quantum well ("MQW") structure. In such an embodiment, the intermediate layer 233 may include a quantum wire structure or a quantum dot structure.

A first electrode pad 235 may be provided or formed on the first semiconductor layer 231, and a second electrode pad 237 may be provided or formed on the second semiconductor layer 232. The first electrode pad 235 may be bonded to the first electrode 211. In an exemplary embodiment where the LED 230 has a vertical structure, the second electrode pad 237 may be located on the opposite side of the first electrode pad 235, and the second electrode 212 contacting the second electrode pad 237 may be disposed on the emission layer 210.

The first electrode 211 may include a reflective layer including Ag, Mg, Al, Pt, Pd, Au, Ni, Nd, Ir, Cr, and a compound thereof, and a transparent or semitransparent electrode layer on the reflective layer. The transparent or semitransparent electrode layer may include at least one selected from indium tin oxide ("ITO"), indium zinc oxide ("IZO"), zinc oxide (ZnO), indium oxide ($In_2O_3$), indium gallium oxide ("IGO"), and aluminum zinc oxide ("AZO").

The second electrode 212 may be provided or formed on the entire surface of the emission layer 210. The second electrode 212 may be a transparent or semitransparent electrode, and include a metallic thin film having a small work function and including Li, Ca, LiF/Ca, LiF/Al, Al, Ag, Mg, and a compound thereof. In an exemplary embodiment, an auxiliary electrode layer or a bus electrode including a material for forming a transparent electrode such as ITO, IZO, ZnO, or $In_2O_3$ may be formed on the metallic thin film. Therefore, the second electrode 212 may transmit light emitted from the LED 230.

However, exemplary embodiments of the display device are not limited to the top-emission type display device, and may be a bottom-emission type display device in which light emitted from the LED 230 is emitted toward the substrate 201. In an exemplary embodiment, the first electrode 211 may include a transparent or semitransparent electrode, and the second electrode 212 may include a reflective electrode. In an alternative exemplary embodiment, the display device 10 may be a dual-emission type display device that emits light in both directions including the front side and the bottom side.

Although FIG. 14 illustrates an exemplary embodiment including a vertical LED 230 in which the first electrode pad 235 and the second electrode pad 237 are disposed opposite to each other, exemplary embodiments are not limited thereto. In an alternative exemplary embodiment, the LED 230 may be a horizontal type LED or a flip type LED (not shown) in which the first electrode pad 235 and the second electrode pad 237 are disposed to face toward a same direction.

The horizontal type LED includes a first semiconductor layer (not shown), a second semiconductor layer (not shown), and an intermediate layer (not shown) between the first and second semiconductor layers. A first electrode pad (not shown) is provided or formed on the first semiconductor layer, and a second electrode pad (not shown) is provided or formed on the second semiconductor layer. In such an embodiment, both the first electrode pad and the second electrode pad may be disposed to face toward a same direction.

In such an embodiment, a portion of the first semiconductor layer and the intermediate layer is removed to expose a portion of the second semiconductor layer. The second electrode pad may be provided or formed on the exposed portion of the second semiconductor layer. In such an embodiment, the area of the second semiconductor layer is greater than the area of the first semiconductor layer and the intermediate layer, and the second electrode pad may be disposed on a portion of the second semiconductor layer that protrudes to the outside of the first semiconductor layer and the intermediate layer.

In such an embodiment, the second electrode contacting the second electrode pad may be provided or formed on a planarization layer (not shown). The second electrode may be provided or formed on a position spaced apart from the first electrode, and formed in a layer in which the first electrode is formed. In an alternative exemplary embodiment, an insulating layer may be disposed between the second electrode and the first electrode, and an opening that exposes the first electrode or the second electrode may be formed in the insulating layer.

The plurality of LEDs 230 may be provided or formed on the first substrate 1. The first substrate 1 may include a conductive substrate or an insulating substrate, and may include, for example, at least one selected from $Al_2O_3$, SiC, Si, GaAs, GaN, ZnO, Si, GaP, InP, Ge, and $Ga_2O_3$.

Each of the plurality of LEDs 230 may include the first semiconductor layer 231, the second semiconductor layer 232, and the intermediate layer 233 between the first semiconductor layer 231 and the second semiconductor layer 232. The first semiconductor layer 231, the intermediate layer 233 and the second semiconductor layer 232 may be formed by using a method such as metal organic chemical vapor deposition ("MOCVD"), chemical vapor deposition ("CVD"), plasma-enhanced chemical vapor deposition ("PECVD"), molecular beam epitaxy ("MBE"), or hydride vapor phase epitaxy ("HVPE"). The first electrode pad 235 may be formed on the first semiconductor layer 231, and the second electrode pad 237 may be formed on the second semiconductor layer 232.

After the plurality of LEDs 230 are transferred onto the second substrate 200, the second electrode 212 contacting the second electrode pad 237 may be formed on the emission layer 210. The second electrode 212 may be formed, for example, on the entire surface of the emission layer 210.

In an exemplary embodiment, as described above, the manufacturing method of the display device 10 may include a method or process of transferring the vertical LED 230 in which the first electrode pad 235 and the second electrode pad 237, but not being limited thereto. An alternative exemplary embodiment of the manufacturing method of the display device 10 may include a method or process of transferring horizontal or flip type LEDs 230 onto the second substrate 200.

Each of the horizontal or flip type LEDs 230 may include a first semiconductor layer (not shown), a second semiconductor layer (not shown), and an intermediate layer (not shown) between the first semiconductor layer and the second semiconductor layer. A first electrode pad (not shown) is formed on the first semiconductor layer, and a second electrode pad (not shown) is formed on the second semiconductor layer. Both the first electrode pad and the second electrode pad may be disposed to face toward the same direction.

In such an embodiment, while the plurality of LEDs 230 are formed, mesa etching may be performed on a region ranging from the first semiconductor layer to a portion of the second semiconductor layer by using reactive ion etching ("RIE"), etc., such that a portion of the second semiconductor layer may be exposed, and then the second electrode pad may be formed on the second semiconductor layer.

In such an embodiment, the first electrode pad and the second electrode pad are simultaneously provided or formed together on the second substrate 200. The second electrode is formed on a position spaced apart from the first electrode. The second electrode may be formed in a layer in which the first electrode is formed, or an insulating layer may be disposed between the second electrode and the first electrode, and an opening that exposes the first electrode or the second electrode may be formed in the insulating layer.

The horizontal or flip type LEDs 230 may be transferred onto the second substrate 200 by using the same method as the method described above. In an exemplary embodiment, the first electrode pad may be bonded to the first electrode, and the second electrode pad may be bonded to the second electrode. Hereinafter, for convenience of description, an exemplary embodiment directed to the vertical LED 230 will be mainly described.

A separate encapsulation portion 214 may be provided or installed on the second electrode 212 to protect the LED 230 from oxygen and moisture. In an exemplary embodiment, the encapsulation portion 214 may include an encapsulation substrate (not shown) including a material that is the same as or similar to that of the substrate 201, or a thin film (not shown) including at least one of an organic layer and an inorganic layer. For convenience of description, an exemplary embodiment where the encapsulation portion 214 includes the thin film will hereinafter be mainly described.

Therefore, the LED transfer 100 may increase productivity by simultaneously transferring a plurality of LEDs. In such an embodiment, the LED transfer 100 may reduce a consumed time by sequentially picking up and transferring a plurality of LEDs 230.

The LED transfer 100 may pick up an LED of various shapes and dispose the LED on various positions.

Figure 15:
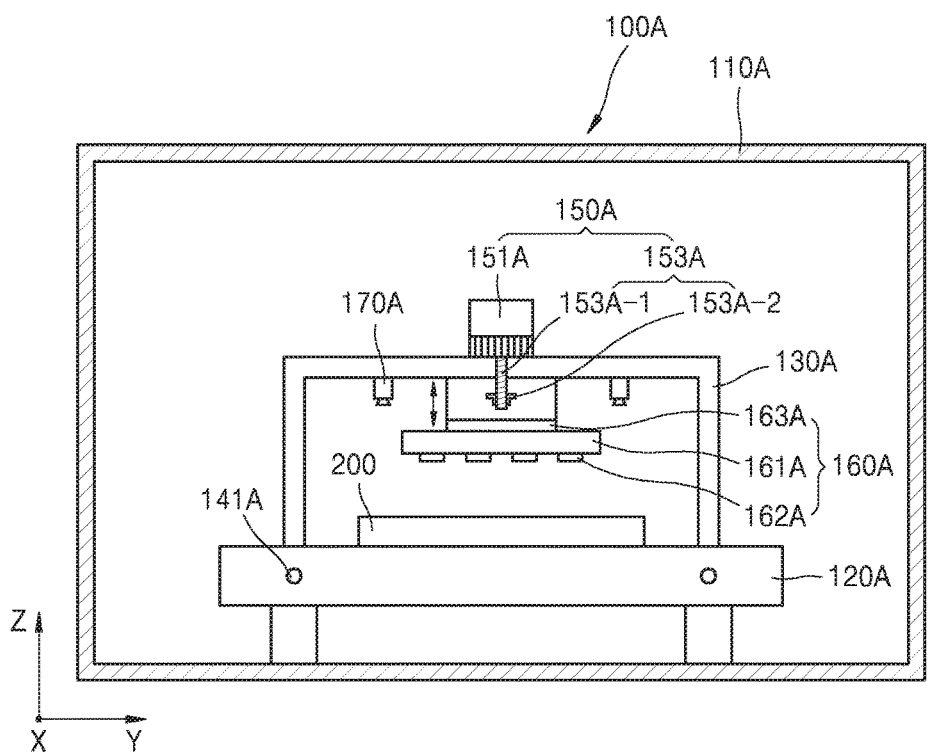
FIG. 15 is a side cross-sectional view illustrating an LED transfer according to another alternative exemplary embodiment.
Figure 16:
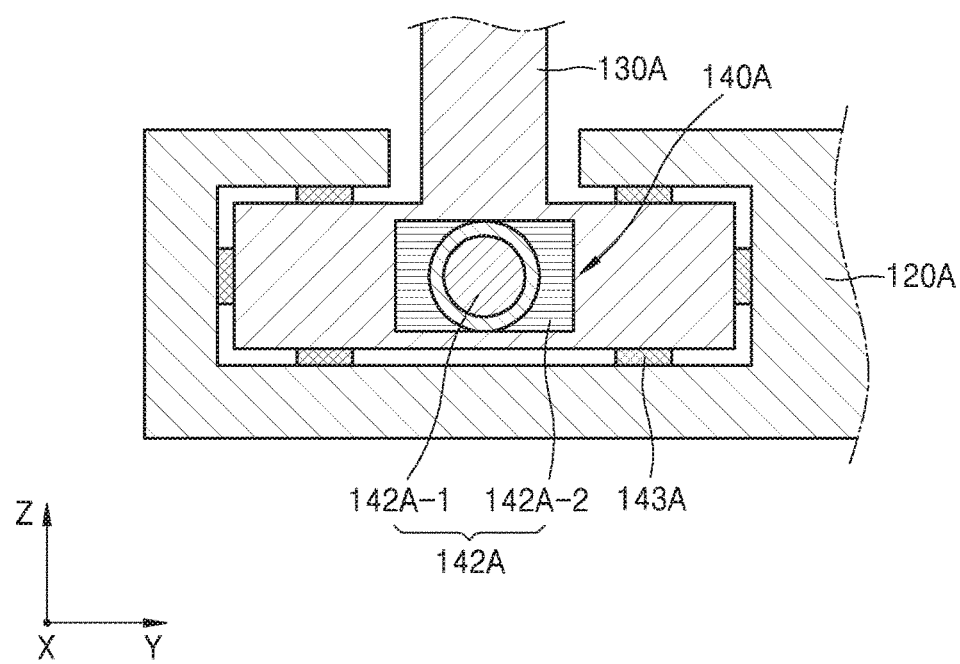
FIG. 16 is a cross-sectional view illustrating a first linear driving portion of an LED transfer illustrated in FIG. 15.
Figure 17:
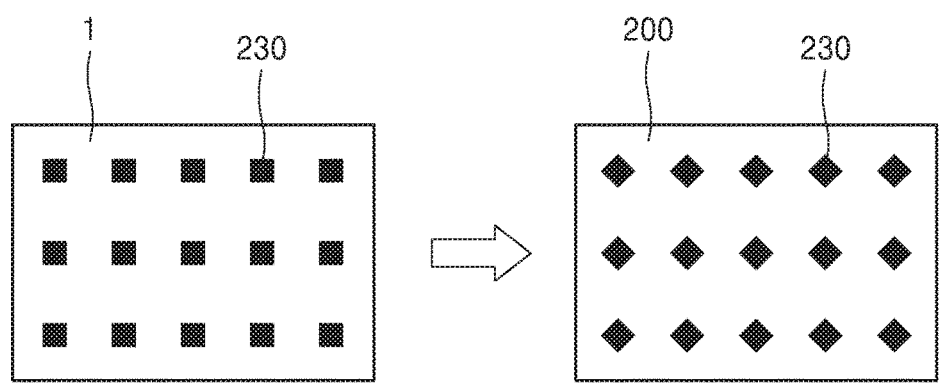
FIG. 17 is a schematic plan view illustrating the arrangement of an LED transferred from a first substrate to a second substrate via an LED transfer illustrated in FIG. 15.

FIG. 15 is a side cross-sectional view illustrating an LED transfer 100A according to an alternative exemplary embodiment. FIG. 16 is a cross-sectional view illustrating a first linear driving portion of the LED transfer 100A illustrated in FIG. 15. FIG. 17 is a schematic plan view illustrating the arrangement of LEDs transferred from a first substrate to a second substrate via the LED transfer 100A illustrated in FIG. 15.

Referring to FIGS. 15 to 17, an exemplary embodiment of the LED transfer 100A may include a chamber 110A, a stage 120A, a moving portion 130A, a first linear driving portion 140A, a second linear driving portion 150A, a head portion 160A and a vision portion 170A. In such an embodiment, the chamber 110A, the stage 120A, the moving portion 130A, and the vision portion 170A are the same as or similar to those described above, and any repetitive detailed description thereof will be omitted.

In such an embodiment, the first linear driving portion 140A may be formed in the various shapes as described above. Hereinafter, an exemplary embodiment of the first linear driving portion 140A will be described in detail with reference to FIG. 16.

An exemplary embodiment of the first linear driving portion 140A may include a first driving motor 141A, a first ball screw 142A, and a first guide portion 143A. In such an embodiment, the first driving motor 141A may be fixed to the stage 120A. In such an embodiment, the first ball screw 142A may be installed to pass through the moving portion 130A and connected with the first driving motor 141A.

The first ball screw 142A may include a first connection portion 142A-2 coupled to the moving portion 130A, and a first screw portion 142A-1 inserted into the first connection portion 142A-2 and which rotates. In an exemplary embodiment, the first screw portion 142A-1 may be connected with the first driving motor 141A and rotate when the first driving motor 141A rotates. In such an embodiment, the first connection portion 142A-2 may linearly move along the first screw portion 142A-1 when the first screw portion 142A-1 rotates.

The first guide portion 143A may be disposed between the moving portion 130A and the stage 120A and reduce frictional force between the moving portion 130A and the stage 120A. In an exemplary embodiment, the first guide portion 143A may have various shapes, such as a linear motion guide, and lubricant. In one exemplary embodiment, for example, the first guide portion 143A may be defined by any unit, structure, and a material disposed between objects for performing relative motion and reducing frictional force. For convenience of description, an exemplary embodiment where the first guide portion 143A includes a linear motion guide will hereinafter be mainly described.

The second linear driving portion 150A may be in the various shapes as described above. Hereinafter, an exemplary embodiment of the second linear driving portion 150A will be described in detail below with reference to FIG. 15.

Similar to the first linear driving portion 140A, the second linear driving portion 150A may include a second driving motor 151A and a second ball screw 153A. In an exemplary embodiment, the second ball screw 153A may include a second connection portion 153A-2 and a second screw portion 153A-1. The second connection portion 153A-2 may be inserted into the head portion 160A and fixed thereto. In such an embodiment, the second screw portion 153A-1 may be installed to pass through the head portion 160A and have an end connected with the second driving motor 151A.

The head portion 160A may include a head body portion 161A, a pick-up portion 162A, and a rotation driving portion 163A. In an exemplary embodiment, the second screw portion 153A-1 may be installed inside the rotation driving portion 163A to pass through the rotation driving portion 163A.

The head body portion 161A may be in various shapes. In one exemplary embodiment, for example, the head body portion 161A may be in a plate shape. According to an alternative exemplary embodiment, the head body portion 161A may be in a bar shape. However, the head body portion 161A is not limited thereto and may be modified to be in various shapes.

The pick-up portion 162A may be disposed on the head body portion 161A. In an exemplary embodiment, the pick-up portion 162A may be provided in plural, and disposed on the surface of the head body portion 161A so that the pick-up portions 162A may be spaced apart from each other with a predetermined interval.

The rotation driving portion 163A may rotate the head body portion 161A. In an exemplary embodiment, the rotation driving portion 163A may rotate the head body portion 161A around a load applied direction of the head body portion 161A as a rotational axis. The rotation driving portion 163A may include a motor.

The LED transfer 100A may transfer the LED 230A from the first substrate 1 to the second substrate 200.

In an exemplary embodiment, after the moving portion 130A is located on the first substrate 1, a position between the head portion 160A and the first substrate 1 is detected via the vision portion 170A, and the position of the head portion 160A may be adjusted to a predetermined position by using the first linear driving portion 140A and the second linear driving portion 150A. In such an embodiment where the head portion 160A is located on the predetermined position when the second linear driving portion 150A operates, the head body portion 161A may descend and the LED 230 may be attached on the pick-up portion 162A. In such an embodiment, when the second linear driving portion 150A operates reversely, the head body portion 161A may ascend, and the LED 230 together with the pick-up portion 162A may be separated from the first substrate 1. In an exemplary embodiment, since a method of separating the LED 230 from the first substrate 1 is the same as or similar to the above-described method, and any repetitive detailed description thereof will be omitted.

As described above, the LED 230 is picked up, and the first linear driving portion 140A may operate to dispose the head portion 160A to the second substrate 200. In such an embodiment, the vision portion 170A may capture a position relation between the head portion 160A and the second substrate 200, and the first linear driving portion 140A and the second linear driving portion 150A may adjust the position of the head portion 160A so that the head portion 160A may correspond to the second substrate 200.

After the position adjustment of the head portion 160A is performed, the rotation driving portion 163A may operate to tilt the head body portion 161A. In an exemplary embodiment, when the rotation driving portion 163A operates, the head body portion 161A may rotate around a z-axis of FIG. 15 as a rotational axis. In an exemplary embodiment where the LED 230 has a quadrangular shape when viewed from a plan view, the LED 230 may be arranged in a rhombus shape depending on the structure of the second substrate 200. In an exemplary embodiment, when the LED 230 is directly transferred onto the second substrate 200 with the head body portion 161A picked-up from the first substrate 1 while the head body portion 161A is not rotated, the shape of a portion of the second substrate 200 on which the LED 230 is seated and the shape of the LED 230 may not correspond to each other. In such an embodiment, the rotation driving portion 163A tilts the head portion 160A around a z-axis of FIG. 15 as a rotational axis, so that the quadrangular LED 230 may be arranged in a rhombus shape.

The LED 230 on the pick-up portion 162A may be transferred onto the second substrate 200 by tilting the head body portion 161A and operating the second linear driving portion 150A to lower the head body portion 161A.

In such an embodiment, the above operation may be repeatedly performed until all of the LEDs 230 are transferred onto the second substrate 200.

Therefore, the LED transfer 100A may increase productivity by simultaneously transferring the plurality of LEDs 230. In such an embodiment, the LED transfer 100A may reduce a consumed time by sequentially picking up and transferring the plurality of LEDs 230.

The LED transfer 100A may pick up an LED of various shapes and dispose the same on various positions. In such an embodiment, the LED transfer 100A tilts the LED 230 having a predetermined shape by a predetermined angle and transfers the LED 230, so that the LED 230 of various arrangements may effectively be transferred.

Figure 18:
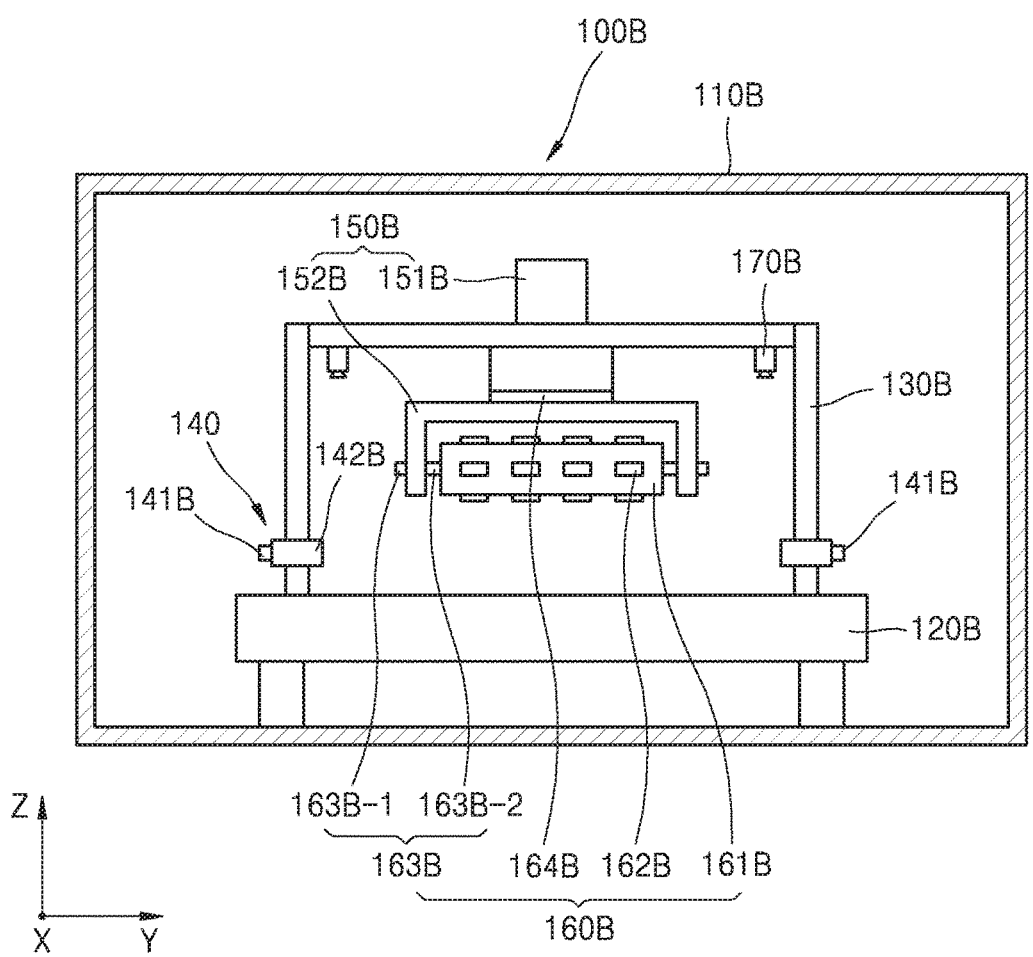
FIG. 18 is a side cross-sectional view illustrating an LED transfer according to another alternative exemplary embodiment.
Figure 19:
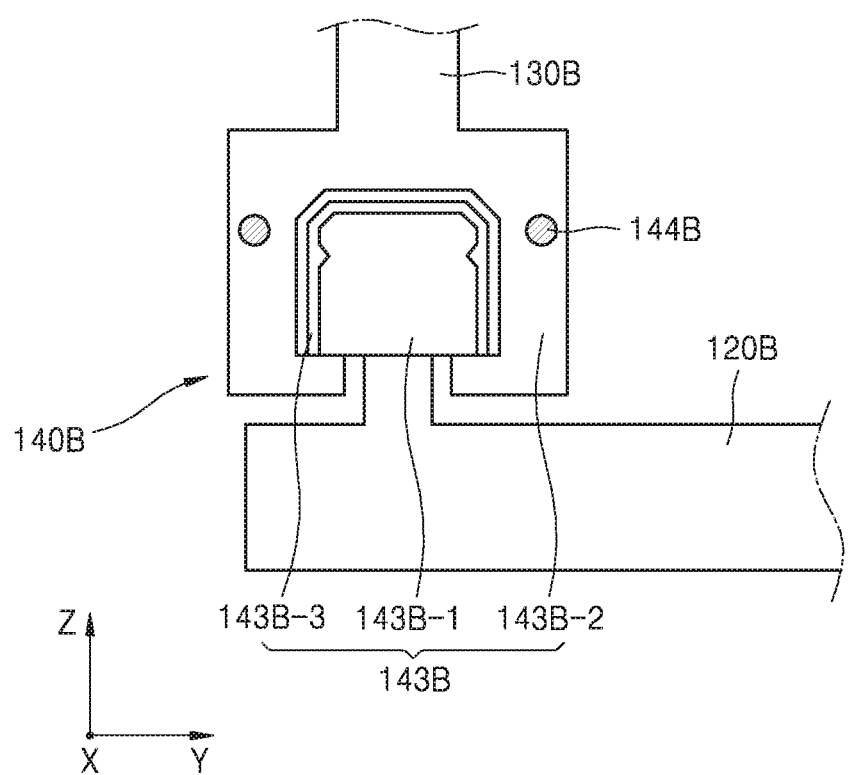
FIG. 19 is a cross-sectional view illustrating a first linear driving portion of an LED transfer illustrated in FIG. 18.

FIG. 18 is a side cross-sectional view illustrating an LED transfer 100B according to another exemplary embodiment. FIG. 19 is a cross-sectional view illustrating a first linear driving portion of the LED transfer 100B illustrated in FIG. 18.

Referring to FIGS. 18 and 19, an exemplary embodiment of the LED transfer 100B may include a chamber 110B, a stage 120B, a moving portion 130B, a first linear driving portion 140B, a second linear driving portion 150B, a head portion 160B, and a vision portion 170B. In an exemplary embodiment, the chamber 110B, the stage 120B, the moving portion 130B and the vision portion 170B are the same as or similar to those described above, and any repetitive detailed description thereof will be omitted.

The first linear driving portion 140B may be in various shapes as described above. Hereinafter, an exemplary embodiment of the first linear driving portion 140B will be described in detail with reference to FIG. 18.

In an exemplary embodiment, the first linear driving portion 140B may include a first driving motor 141B, a first pulley 142B-1, a second pulley (not shown), a first wire 144B, and a first guide portion 143B. In such an embodiment, the first wire 144B may pass through the moving portion 130B and may be wound on one of the first pulley 142B-1 and the second pulley, or released from the other of the first pulley 142B-1 and the second pulley. In such an embodiment, the first driving motor 141A may be connected to at least one of the first pulley 142B-1 and the second pulley and rotate at least one of the first pulley 142B-1 and the second pulley.

The first wire 144B may be fixed inside the moving portion 130B. In such an embodiment, the first pulley 142B-1 and the second pulley may be installed to face each other in a length direction (an x-axis direction of FIG. 18) of the stage 120B.

The first guide portion 143B may be installed between the moving portion 130B and the stage 120B. In an exemplary embodiment, the first guide portion 143B may include a first rail portion 143B-1 installed to one of the moving portion 130B and the stage 120B, a first sliding portion 143B-2 seated and moving on the first rail portion 143B-1, and a first bearing portion 143B-3 disposed between the first rail portion 143B-1 and the first sliding portion 143B-2. For convenience of description, an exemplary embodiment where the first rail portion 143B-1 is disposed on the stage 120B will hereinafter be mainly described.

The second linear driving portion 150B may be in various shapes as described above. However, for convenience of description, an exemplary embodiment where the second linear driving portion 150B includes a cylinder will hereinafter be mainly described.

In such an embodiment, the second linear driving portion 150B may include a position variation portion 151B and a fixing bracket 152B. The head portion 160B may include a head body portion 161B, a pick-up portion 162B, and rotation driving portions 163B and 164B. In such an embodiment, the head body portion 161B and the pick-up portion 162B are the same as or similar to those described above, and any repetitive detailed description thereof will be omitted.

The rotation driving portion may include the first rotation driving portion 164B disposed between the fixing bracket 152B and the position variation portion 151B and connecting the fixing bracket 152B with the position variation portion 151B. In such an embodiment, the rotation driving portion may include the second rotation driving portion 163B installed to the fixing bracket 152B and connected to the head body portion 161B.

In an exemplary embodiment, the first rotation driving portion 164B may include the above-described general motor. The second rotation driving portion 163B may include a rotation motor 163B-1 and a rotational shaft 163B-2. The rotation motor 163B-1 may be installed to the fixing bracket 152B, and connected to the rotational shaft 163B-2 installed to pass through the head body portion 161B.

An operation of the LED transfer 100B may be the same as or similar to that described above. The LED transfer 100B may pick up the LED 230 of a first substrate (not shown) by using the pick-up portion 162B and transfer the LED 230 onto the second substrate 200.

In an exemplary embodiment, the vision portion 170B may capture a position relation between the first substrate and the head portion 160B, and a position relation between the second substrate 200 and the head portion 160B, and provide a base for adjusting the position of the head portion 160B.

In such an embodiment, the first linear driving portion 140B may dispose the head portion 160B on the first substrate and the second substrate 200 by moving the moving portion 130B. The second linear driving portion 150B may allow the pick-up portion 162B to pick up the LED 230 of the first substrate by raising/lowering the head portion 160B, and transfer the LED 230 on the pick-up portion 162B onto the second substrate 200.

The first rotation driving portion 164B may rotate the fixing bracket 152B and the head body portion 161B around a load applied direction (or a z-axis of FIG. 18) of the head body portion 161B as a rotational axis. In an exemplary embodiment, as described above, the LED 230 having a quadrangular shape may be transferred onto the second substrate 200 in a rhombus shape.

In an exemplary embodiment, the second rotation driving portion 163B may rotate the head body portion 161B around a length direction (or a y-axis of FIG. 18) of the head body portion 161B as a rotational axis. In such an embodiment, it is possible to pick up a plurality of LEDs 230 at a time by using a plurality of pick-up portions 162B forming a plurality of lines on the surface of the head body portion 161B, and sequentially transfer the plurality of LEDs 230 onto the second substrate 200.

In an exemplary embodiment described herein, the LED transfer 100B may increase productivity by simultaneously transferring the plurality of LEDs 230. In such an embodiment, the LED transfer 100B may reduce a consumed time by sequentially picking up and transferring the plurality of LEDs 230.

In an exemplary embodiment, the LED transfer 100B may pick up an LED of various shapes and dispose the same on various positions. In such an embodiment, the LED transfer 100B tilts the LED 230 having a predetermined shape by a predetermined angle and transfers the same, so that the LED 230 of various arrangements may be transferred.

Though the inventive concept has been described with reference to exemplary embodiments illustrated in the drawings, these are provided for an exemplary purpose only, and those of ordinary skill in the art will understand that various modifications and other equivalent embodiments may be made therein. Therefore, the spirit and scope of the inventive concept should be defined by the following claims.

What is claimed is:

1. A transferring method of a light-emitting diode, the method comprising:
    seating a first substrate above a support;
    attaching a plurality of light-emitting diodes disposed above the first substrate to a head portion while rotating the head portion around a rotational axis that is parallel with a major surface plane defining the first substrate;
    disposing the head portion above a second substrate by allowing the head portion to perform a linear motion; and
    simultaneously transferring a plurality of light-emitting diodes defining a portion of the plurality of light-emitting diodes from the head portion to the second substrate while rotating the head portion around the rotational axis.

2. The method of claim 1, wherein the transferring of the portion of the plurality of light-emitting diodes from the first substrate to the second substrate while rotating the head portion comprises: allowing the head portion to perform a linear motion.

3. The method of claim 1, wherein the transferring of the light-emitting diode is performed under a vacuum state.

4. The method of claim 1, further comprising: aligning the head portion with the first substrate.

5. The method of claim 1, further comprising: aligning the head portion with the second substrate.

6. The method of claim 1, wherein the first substrate comprises a base substrate or a carrier substrate, and the second substrate comprises the carrier substrate or a display substrate.

7. A transferring method of a light-emitting diode, the method comprising:
    transferring a first substrate and a second substrate from outside of a chamber to inside of the chamber;
    seating the first substrate and the second substrate above a support;
    attaching a plurality of light-emitting diodes disposed above the first substrate to a head portion while rotating the head portion;
    disposing the head portion above the second substrate by allowing the head portion to perform a linear motion; and
    transferring a plurality of light-emitting diodes defining a portion of the plurality of light-emitting diodes from the head portion to the second substrate while rotating the head portion around a rotational axis that is parallel with a major surface plane defining the first substrate.

* * * * *